(12) United States Patent
Sato (10) Patent No.: US 9,437,659 B2
(45) Date of Patent: Sep. 6, 2016

(54) ORGANIC ELECTROLUMINESCENT DISPLAY DEVICE

(71) Applicant: Japan Display Inc., Tokyo (JP)

(72) Inventor: Toshihiro Sato, Tokyo (JP)

(73) Assignee: JAPAN DISPLAY INC., Tokyo (JP)

(*) Notice: Subject to any disclaimer, the term of this patent is extended or adjusted under 35 U.S.C. 154(b) by 0 days.

(21) Appl. No.: 14/469,623

(22) Filed: Aug. 27, 2014

(65) Prior Publication Data

US 2015/0060815 A1    Mar. 5, 2015

(30) Foreign Application Priority Data

Aug. 29, 2013  (JP) ................................ 2013-178677

(51) Int. Cl.
*G02F 1/1333* (2006.01)
*H01L 27/32* (2006.01)
*H01L 51/52* (2006.01)

(52) U.S. Cl.
CPC ....... *H01L 27/3246* (2013.01); *H01L 51/5209* (2013.01)

(58) Field of Classification Search
CPC ........... H01L 29/7869; H01L 27/1225; H01L 29/66969; H01L 21/02565; H01L 29/78696
USPC .................................................... 349/158, 96
See application file for complete search history.

(56) References Cited

U.S. PATENT DOCUMENTS

| | | | | |
|---|---|---|---|---|
| 6,351,010 B1* | 2/2002 | Yamanaka | .......... | G02F 1/13454 257/350 |
| 7,369,209 B2* | 5/2008 | Kinoshita | ......... | G02F 1/133305 349/158 |
| 2002/0006681 A1* | 1/2002 | Yamanaka | .............. | C30B 13/00 438/29 |
| 2004/0222736 A1 | 11/2004 | Yoneda | | |
| 2015/0060832 A1* | 3/2015 | Ito | ....................... | H01L 51/5225 257/40 |

FOREIGN PATENT DOCUMENTS

JP    2012-203121 A    10/2012
JP    2012-234748 A    11/2012

OTHER PUBLICATIONS

Korean Office Action dated on Jan. 5, 2016 for corresponding Korean Patent Application No. 10-2014-0111612.

* cited by examiner

*Primary Examiner* — Brett Feeney
*Assistant Examiner* — Tsz Chiu
(74) *Attorney, Agent, or Firm* — Typha IP LLC (57) ABSTRACT

An organic electroluminescent display device includes: a substrate; plural anodes that are formed in respective pixels; pixel separation films that cover at least an edge of the respective anodes between the respective pixels; an organic layer that covers a display area over the plurality of anodes, and the pixel separation films, and includes at least a light emitting layer; a cathode that is formed on the organic layer; and a counter substrate that is arranged on the cathode so as to face the substrate, in which the anodes each include: a contact area that comes in contact with the organic layer, and faces a corresponding pixel of the counter substrate, and a peripheral area that is formed around the contact area, and faces pixels around the corresponding pixels of the counter substrate. The organic electroluminescent display device can realize higher definition, higher luminance, and prevention of color mixture.

6 Claims, 9 Drawing Sheets

ORGANIC ELECTROLUMINESCENT DISPLAY DEVICE

CROSS-REFERENCE TO RELATED APPLICATION

The present application claims priority from Japanese application JP2013-178677 filed on Aug. 29, 2013, the content of which is hereby incorporated by reference into this application.

BACKGROUND OF THE INVENTION

1. Field of the Invention

The present invention relates to an organic electroluminescent display device.

2. Description of the Related Art

Attention has been paid to an organic electroluminescent display device as a thin and lightweight light emitting source, and a large number of image display devices having the organic electroluminescent display device have been developed. An electroluminescent light emitting element has a structure in which an organic layer having a light emitting layer is sandwiched between an anode and a cathode.

As the organic electroluminescent display device of this type, for example, JP 2012-234748 A discloses a structure having a flattening film in which concave potions functioning as a guide for bank formation are formed, banks formed in the concave portions, and an organic light emitting layer formed within an area defined by the banks.

SUMMARY OF THE INVENTION

Figure 9:
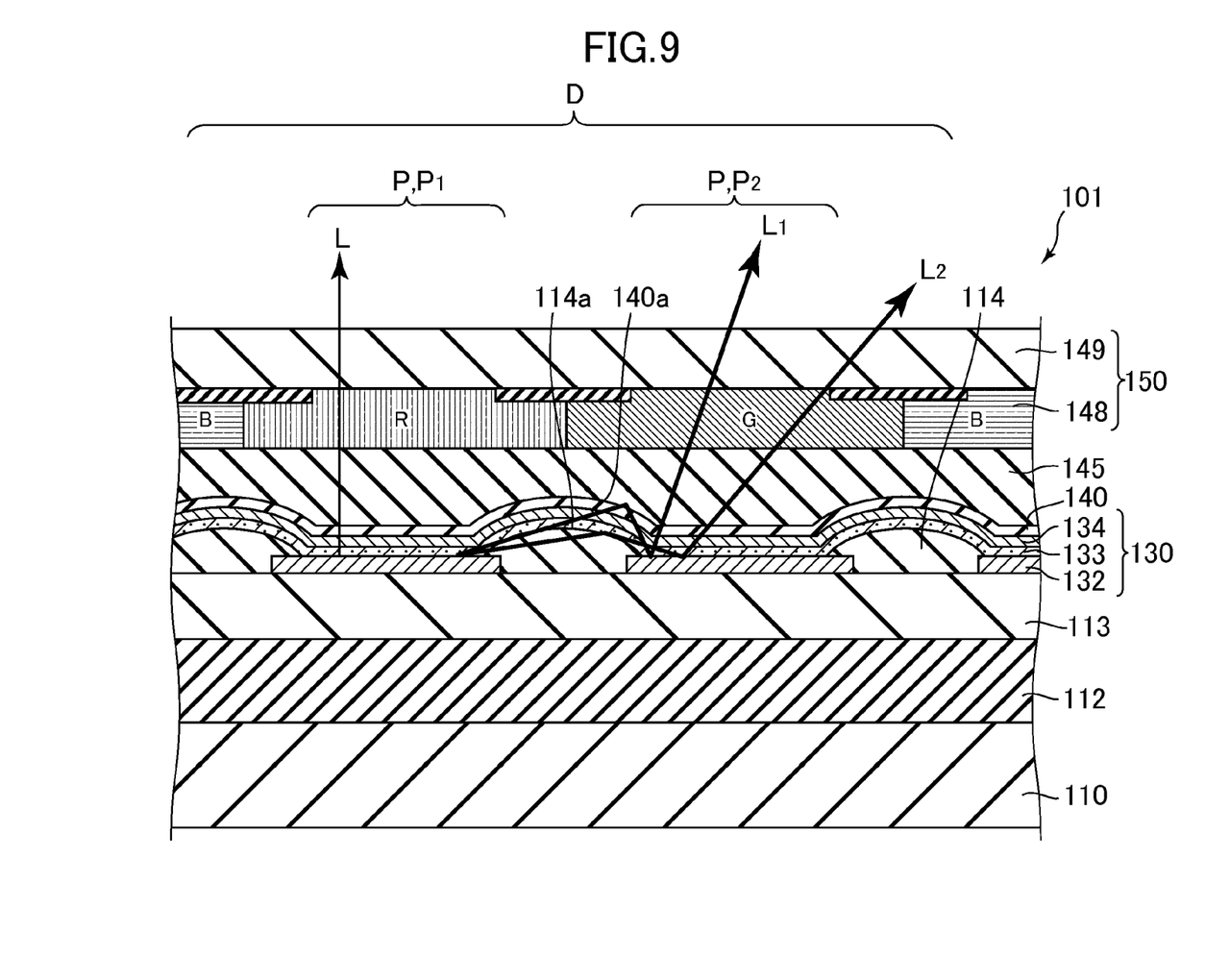
FIG. 9 is a schematic cross-sectional view illustrating apart of a display area of an organic electroluminescent display device in a related art.

FIG. 9 is a schematic cross-sectional view of a part of a display area D in a related art organic electroluminescent display device 101. The organic electroluminescent display device 101 includes a circuit layer 112 and a flattening film 113 that are formed over a substrate 110, anodes 132 formed for respective pixels P(P1, P2), pixel separation films 114 that cover at least an edge of the respective anodes 132, an organic layer 133 that includes at least a light emitting layer, and covers the anodes 132 and the pixel separation films 114 over the display area D, a cathode 134 that is formed on the organic layer 133, a sealing film 140 that covers the cathode 134, and a counter substrate 150 that includes a glass substrate 149 in which color filters 148 are formed, and is arranged over the sealing film 140 through a filter 145.

In the configuration described above, apart of emitted light L from the organic layer 133 in the pixel P1 is reflected from an interface 114a of each pixel separation film 114, or an interface 140a of the sealing film 140. The reflected lights L1 and L2 travel to the substrate 110 side, and are reflected from the anode 132 of the adjacent pixel P2 toward the counter substrate 150 side. As a result, the reflected lights L1 and L2 are emitted from an area corresponding to the pixel P2 of the counter substrate 150. For that reason, the emitted light L from a desired pixel P1 emitted through the color filter 148 corresponding to the adjacent pixel P2 with the results that color mixture is produced, and a luminance reduction occurs in the desired pixel P1.

Also, because a distance between the adjacent pixels P is shorter as the pixel P is finer, the color mixture caused by the reflected lights L1 and L2 is liable to occur. This makes it difficult that the related art organic electroluminescent display device 101 realizes higher definition, higher luminance, and the prevention of color mixture.

The invention has been made under the above circumstances, and therefore aims at realizing the higher definition, the higher luminance, and the prevention of color mixture in the organic electroluminescent display device.

(1) According to the invention, there is provided an organic electroluminescent display device, including: a substrate; a plurality of anodes that are formed in respective pixels arranged in a display area of the substrate in a matrix; pixel separation films that are made of an insulating material, and cover at least an edge of the respective anodes between the respective pixels; an organic layer that is made of an organic material, covers the display area over the plurality of anodes, and the pixel separation films, and includes at least a light emitting layer; a cathode that is formed on the organic layer; and a counter substrate that is arranged on the cathode so as to face the substrate, in which the anodes each include a contact area that comes in contact with the organic layer, and faces a corresponding pixel of the counter substrate, and a peripheral area that is formed around the contact area, and faces pixels around the corresponding pixels of the counter substrate.

(2) According to the invention, in the organic electroluminescent display device according to the item (1), the peripheral area may face the pixel adjacent to the corresponding pixel of the counter substrate.

(3) According to the invention, the organic electroluminescent display device according to the item (2), further may include an insulating film that is arranged between the substrate and the anodes, and has a trench recessed in the substrate direction between the respective pixels, in which the peripheral area is formed by forming a film on the trench.

(4) According to the invention, in the organic electroluminescent display device according to the item (3), the insulating film may be separated for each of the pixels.

(5) According to the invention, in the organic electroluminescent display device according to the item (3) or (4), the pixel separation films each may cover at least a part of the trench.

(6) According to the invention, in the organic electroluminescent display device according to any one of the item (1) to (5), the counter substrate may be a color filter substrate.

(7) According to the invention, there is provided an organic electroluminescent display device, including: a substrate; plural anodes that are formed in respective pixels arranged in a display area of the substrate in a matrix; pixel separation films that are made of an insulating material, and cover an edge of the respective anodes between the respective pixels; an organic layer that is made of an organic material, covers the display area over the plurality of anodes, and the pixel separation films, and includes at least a light emitting layer; and a cathode that is formed on the organic layer, in which a surface of the pixel separation films on a side farther from the substrate is located on the substrate side of the light emitting layer.

(8) According to the invention, in the organic electroluminescent display device according to the item (7), the light emitting layer may include two or more light emitting layers that emit light having a wavelength region different from each other, which are formed for each of the pixels.

(9) According to the invention, in the organic electroluminescent display device according to the item (7) or (8), the anodes each may include: a contact area that comes in contact with the organic layer, and faces a corresponding pixel of the counter substrate, and a peripheral area that is formed around the contact area, and faces pixels around the corresponding pixels of the counter substrate.

(10) According to the invention, in the organic electroluminescent display device according to the item (9), the peripheral area may face the pixel adjacent to the corresponding pixel of the counter substrate.

(11) According to the invention, the organic electroluminescent display device according to the item (10) may further include: an insulating film that is arranged between the substrate and the anodes, and has a trench recessed in the substrate direction between the respective pixels, in which the peripheral area is formed by forming a film on the trench.

(12) According to the invention, in the organic electroluminescent display device according to the item (11), the insulating film may be separated for each of the pixels.

According to any one of the above items (1) to (6), even if the distance between the adjacent pixels is shorter, as compared with the organic electroluminescent display device without the above configuration, the surrounding pixels can be prevented from emitting light by reflection of a light emitted from a desired pixel. With this configuration, the higher definition, the higher luminance, and the prevention of color mixture can be realized.

According to any one of the above items (7) to (12), even if the distance between the adjacent pixels is shorter, as compared with the organic electroluminescent display device without the above configuration, the light emitted from the desired pixel can be prevented from being reflected from an interface of the pixel separation film, and the light emitted from the surrounding pixels due to the reflected light is prevented. With this configuration, the higher definition, the higher luminance, and the prevention of color mixture can be realized.

DETAILED DESCRIPTION OF THE INVENTION

Hereinafter, an organic electroluminescent display device according to an embodiment of the invention will be described with an organic electroluminescent display device 1 as an example with reference to the accompanying drawings. The drawings referred to in the following description may illustrate an enlarged portion of the features for convenience in order to facilitate understanding of the features, and the size ratio of the respective components is not always identical with a real one. Also, the materials exemplified in the following description are exemplary, and the respective components may be made of materials different from the exemplified materials, and can be implemented with changes without departing from the spirit thereof.

Figure 1:
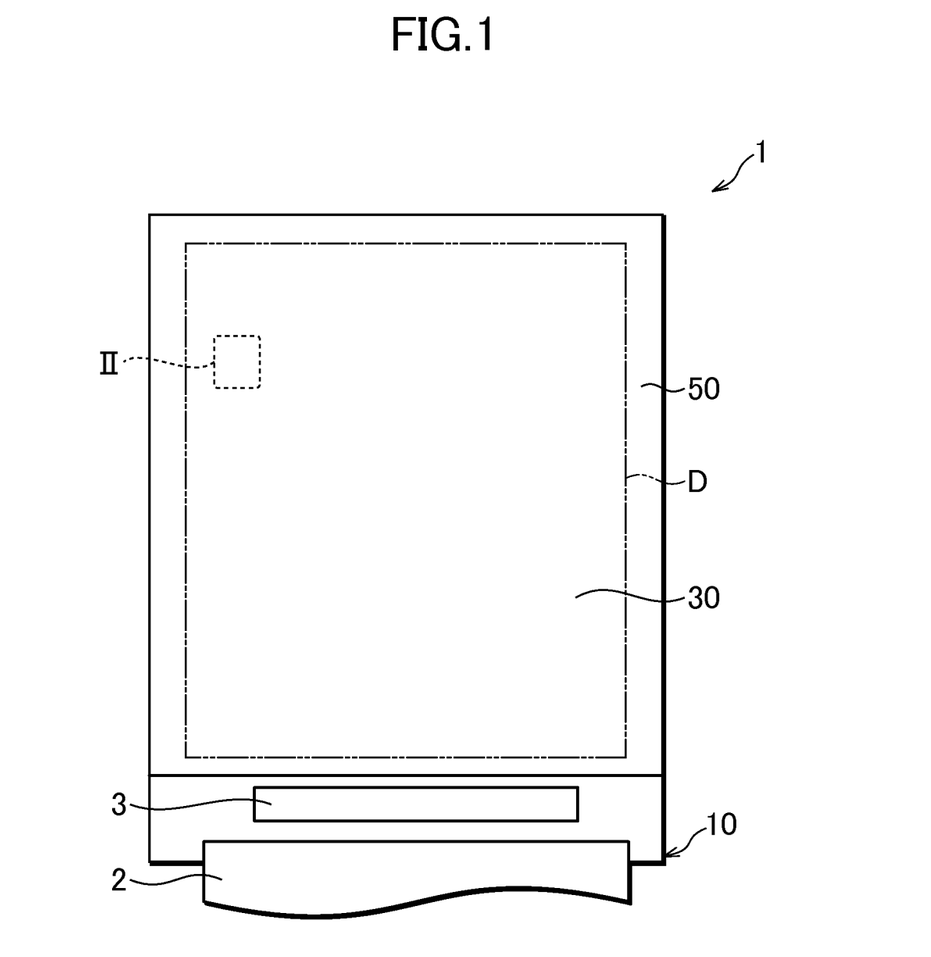
FIG. 1 is a schematic plan view of an organic electroluminescent display device according to this embodiment.

FIG. 1 is a schematic plan view of an organic electroluminescent display device 1 according to this embodiment. An area of an upper surface 10a of a substrate 10 in which a counter substrate 50 is not arranged is connected with a flexible circuit board 2, and also provided with a driver IC (integrated circuit) 3. The driver IC 3 is an IC that is arranged on the substrate 10, and receives image data from an external of the organic electroluminescent display device 1 through the flexible circuit board 2. The driver IC 3 receives the image data, and supplies a voltage signal to be supplied to the respective pixels, to an organic electroluminescent light emitting element 30 through data lines not shown.

Figure 2:
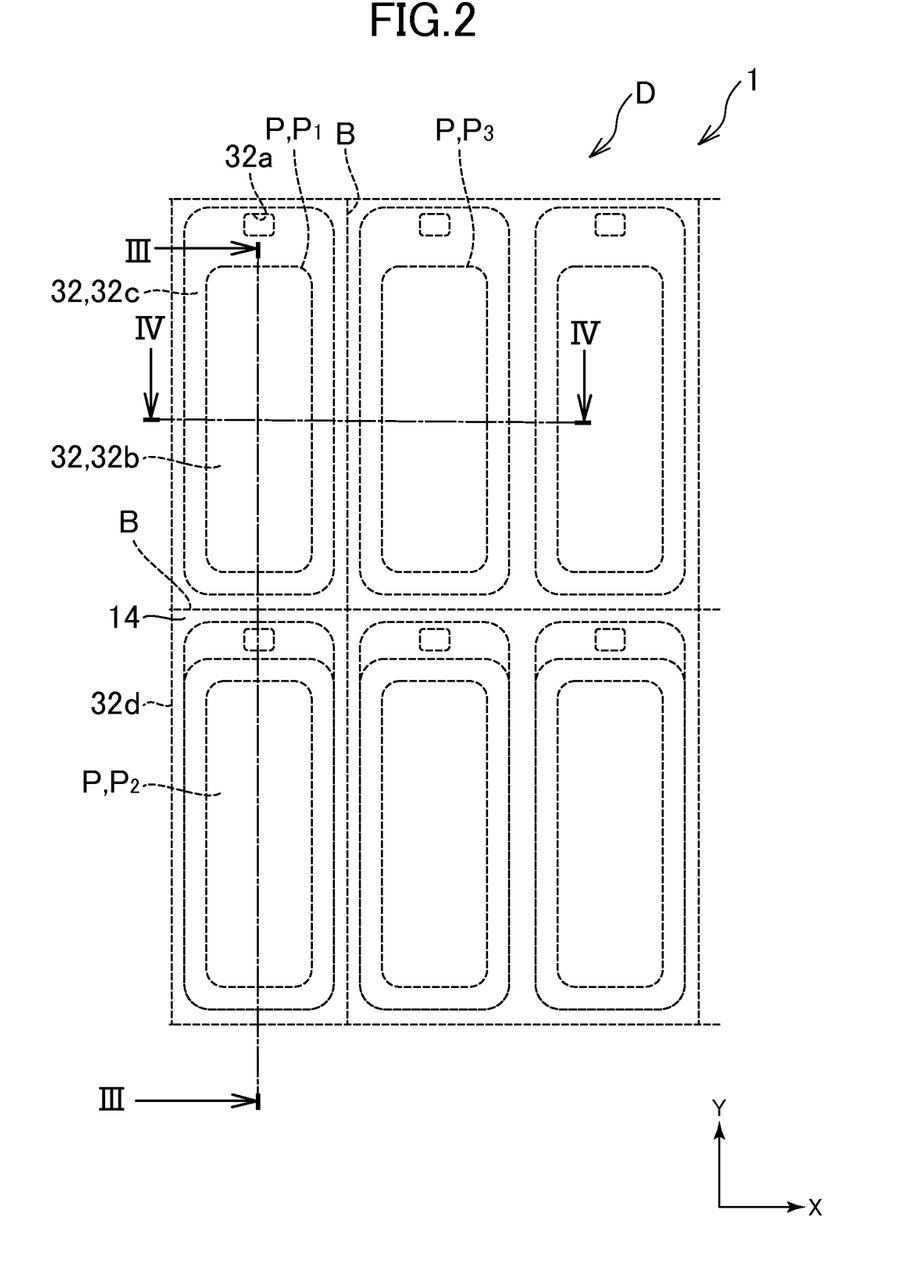
FIG. 2 is a partially enlarged view of an area II in the organic electroluminescent display device illustrated in FIG. 1.

Subsequently, a configuration of a display area D in the organic electroluminescent display device 1 will be described in detail. FIG. 2 is a partially enlarged view of an area II in the organic electroluminescent display device 1 illustrated in FIG. 1. For convenience of description, in FIG. 2, a configuration of anodes 32 (to be described later) in the respective pixels P will be mainly described.

The anodes 32 are formed in a matrix in correspondence with the respective pixels P. In this embodiment, for example, it is assumed that a pixel P adjacent to a pixel P1 in a Y-direction is a pixel P2, and a pixel P adjacent to a pixel P1 in an X-direction is a pixel P3. Also, the anodes 32 are connected to respective contact holes 32a.

The anodes 32 each include a contact area 32b that comes in contact with an organic layer 33 which will be described later, and a peripheral area 32c formed around the contact area 32b. The contact area 32b is an area that comes in contact with the organic layer 33 to be described later to inject a drive current thereinto. Also, an area in which the contact area 32b is formed corresponds to an area in which the organic layer 33 emits light.

The peripheral area 32c is an area in which the reflected light from the surround pixel P is reflected toward the counter substrate 50 of the surrounding pixel P. For example, a light that travels toward the adjacent pixels P2 and P3 among the light emitted from the pixel P1 is reflected toward the counter substrate 50 of the pixel P1 by the peripheral areas 32c of the anodes 32 in the pixel P2 and the pixel P3. The configuration of the anodes 32 and the details of the reflection of the light emitted from the pixel P1 will be described later for convenience of description.

Figure 3:
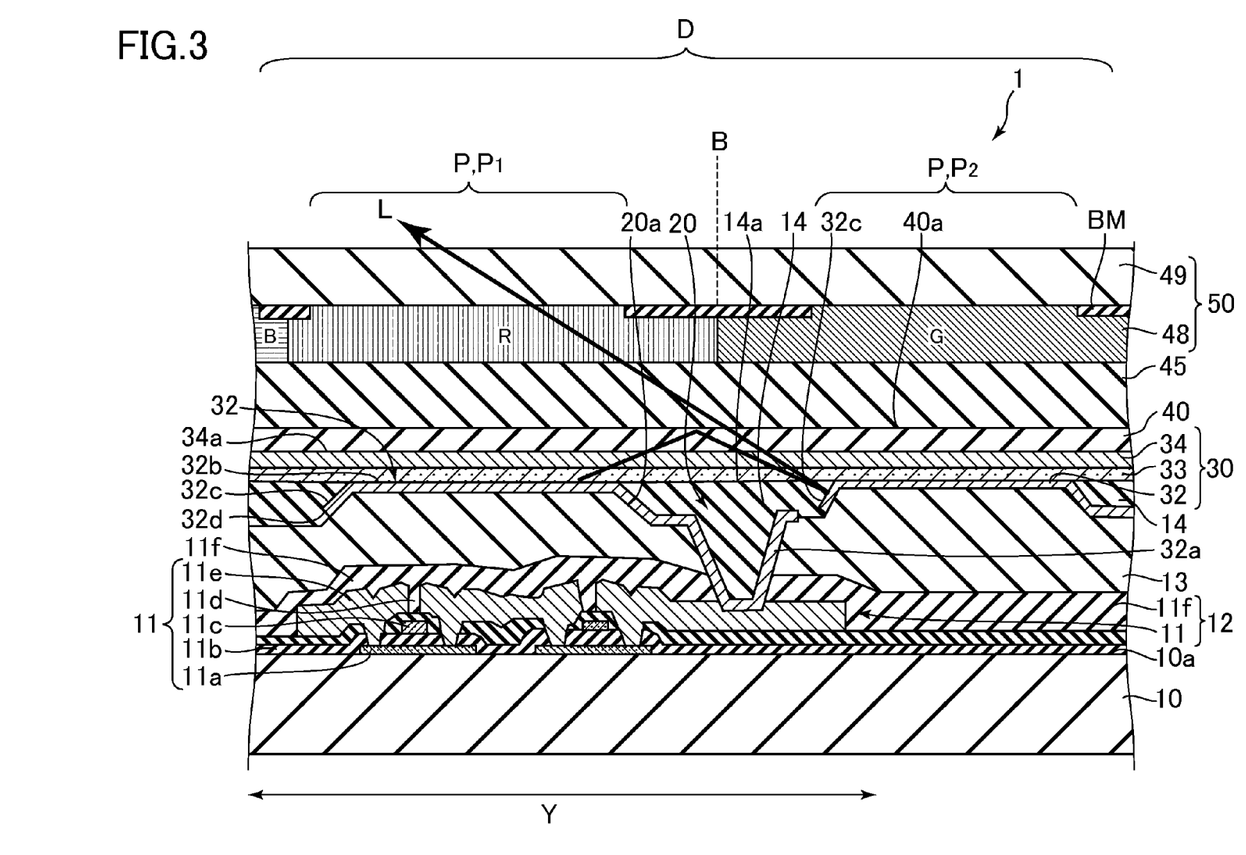
FIG. 3 is a schematic cross-sectional view of the organic electroluminescent display device illustrated in FIG. 2, taken along a line III-III.
Figure 4:
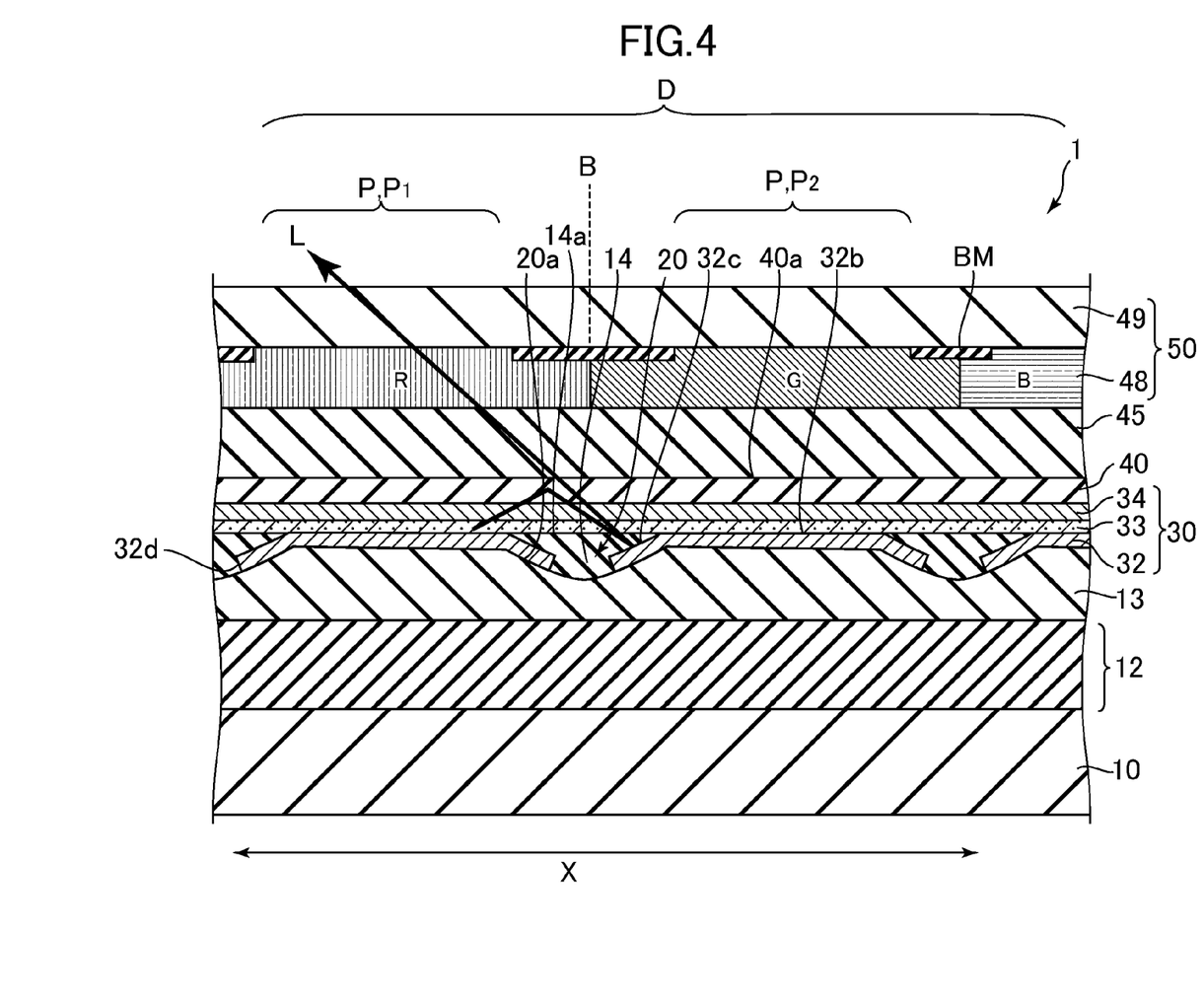
FIG. 4 is a schematic cross-sectional view of the organic electroluminescent display device illustrated in FIG. 2, taken along a line IV-IV.

FIG. 3 is a schematic cross-sectional view of the organic electroluminescent display device 1 illustrated in FIG. 2, taken along a line III-III, and FIG. 4 is a schematic cross-sectional view of the organic electroluminescent display device 1 illustrated in FIG. 2, taken along a line IV-IV.

As illustrated in FIGS. 3 and 4, thin film transistors 11, a circuit layer 12 on which electric wires not shown are formed, a flattening film 13, the organic electroluminescent light emitting elements 30, a sealing film 40, a filler 45, and the counter substrate 50 are laminated on the substrate 10 in the display area D.

The substrate 10 is formed of an insulating substrate, which is a member in which the circuit layer 12 and the organic electroluminescent light emitting element 30 are formed on the upper surface 10a in order.

The circuit layer 12 is a layer in which the thin film transistors 11, a passivation film 11f, and electric wiring not shown are formed, and formed for driving the organic electroluminescent light emitting element 30. The thin film transistors 11 are disposed on the substrate 10 for the respective pixels P. Specifically, the thin film transistors 11 each include, for example, a polysilicon semiconductor layer 11a, a gate insulating layer 11b, a gate electrode 11c, a gate/drain electrode 11d, and a first insulating film lie. Also, the thin film transistors 11 are covered with a passivation film 11f.

The flattening film 13 is formed to cover, for example, the circuit layer 12. The flattening film 13 is a layer made of an insulating material, and is formed between the substrate 10 and the organic electroluminescent light emitting elements 30, to thereby electrically isolate the adjacent thin film transistors 11 from each other, or the thin film transistors 11 and the organic electroluminescent light emitting elements 30 from each other. The flattening film 13 is made of a material having an insulating property such as $SiO_2$, SiN, acrylic, or polyamide.

A groove portion 20 which is a groove-like portion recessed in the substrate 10 direction is formed in the flattening film 13. The groove portion 20 is a portion in which the contact hole 32a, which will be described later, is formed in this embodiment. The groove portion 20 may be formed to extend along a boundary B between the pixel P1, and the pixel P2 as well as the pixel P3 without being limited to the portion of the contact hole 32a.

Figure 5:
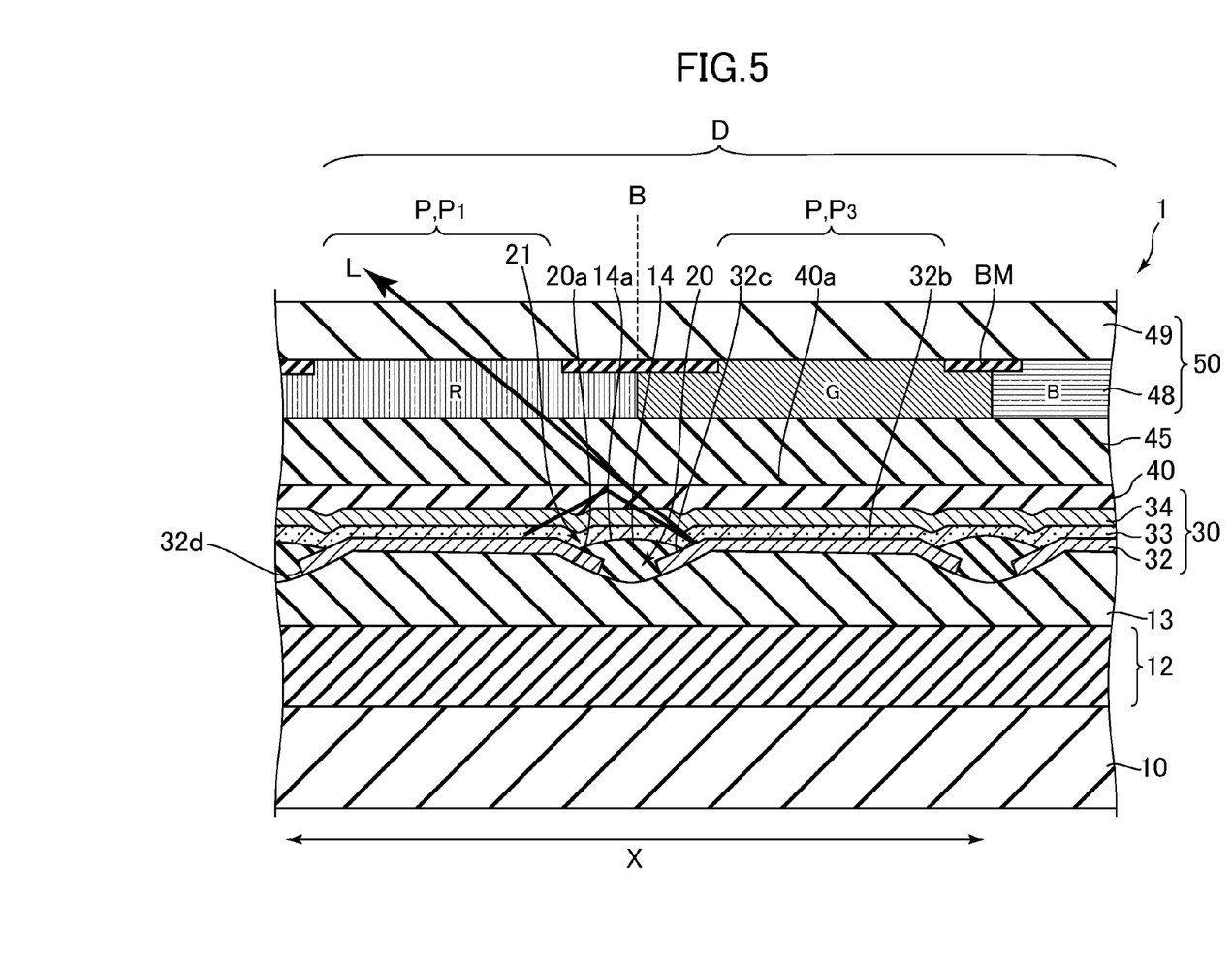
FIG. 5 is a schematic cross-sectional view illustrating one modification of the organic electroluminescent display device according to this embodiment, in the same view as that of FIG. 4.

A surrounding area formation surface 20a which is an inner peripheral surface of the groove portion 20 is an area in which a surrounding area 32c of the anode 32 is formed. The surrounding area formation surface 20a faces the counter substrate 50 in the pixel P around the pixel P on a side where the surrounding area formation surface 20a is formed. Specifically, for example, as illustrated in FIG. 4, the flexible circuit board 20a in the pixel P1 faces the region G of the counter substrate 50 in the pixel P2 adjacent to the pixel P1 in the Y-direction. Also, as illustrated in FIG. 5, the surrounding area formation surface 20a in the pixel P1 faces the region G of the counter substrate 50 in the pixel P3 adjacent to the pixel P1 in the X-direction.

A reflective film not shown may be formed in the areas and the surrounding area formation surfaces 20a corresponding to the respective pixels P on the flattening film 13. The reflective film is disposed for reflecting the light emitted from the organic electroluminescent light emitting element 30 toward the counter substrate 50 side. It is preferable that the reflective film is higher in optical reflectance, and the reflective film can be formed of a metal film made of, for example, aluminum or silver (Ag).

The plural organic electroluminescent light emitting elements 30 are formed over the flattening film 13, for example, through the reflective film. The plural organic electroluminescent light emitting elements 30 are disposed in a matrix in an area corresponding to the display area D on the upper surface 10a of the substrate 10.

The organic electroluminescent light emitting elements 30 each include the anode 32, the organic layer 33 having at least a light emitting layer, and a cathode 34 formed to cover the organic layer 33 to function as a light emitting source.

Each of the anodes 32 is an electrode for injecting the drive current. Each of the anodes 32 is connected to the contact hole 32a so as to be electrically connected to the thin film transistor 11, and receives the drive current from the thin film transistor 11.

The anodes 32 are made of a material having conductivity. Specifically, it is preferable that the anodes 32 are made of, for example, ITO (indium tin oxide). The anodes 32 may be made of a material having translucency and conductivity such as IZO (indium zinc complex oxide), tin oxide, zinc oxide, indium oxide, or aluminum composite oxide. The reflective film is made of a metal such as silver, and if the reflective film comes in contact with the anode 32, the anode 32 may have translucency. In this configuration, the reflective film is a part of the anode 32.

As described above, each of the anodes 32 has the contact area 32b and the surrounding area 32c. The contact area 32b is formed over the flattening film 13 through, for example, the reflective film. Also, the contact area 32b faces the pixel of the counter substrate 50 corresponding to the pixel in which the contact area 32b is formed. Specifically, for example, as illustrated in FIG. 4, the contact area 32b in the pixel P1 faces the area (area R in FIG. 4) of the counter substrate 50 in the pixel P1.

In the present specification, "the contact area 32b in the pixel P1 faces the counter substrate 50 in the pixel P1" specifically represents that a normal of the contact area 32b in the pixel P1 intersects with the counter substrate 50 (area R) in the pixel P1.

The surrounding area 32c is configured by, for example, forming a part of the anode 32 along the surrounding area formation surface 20a of the groove portion 20. The surrounding area 32c faces the counter substrate 50 of another pixel P around the pixel P in which the surrounding area 32c is formed. Specifically, for example, as illustrated in FIG. 4, a normal of the surrounding area 32c of the anode 32 in the pixel P1 intersects with the area (area G in FIG. 4) of the counter substrate 50 in the pixel P2 adjacent to the pixel P1 in the Y-direction. Also, as illustrated in FIG. 5, a normal of the surrounding area 32c of the anode 32 in the pixel P1 intersects with the area G of the counter substrate 50 in the pixel P3 adjacent to the pixel P1 in the X-direction.

The surrounding area 32c is formed along the surrounding area formation surface 20a of the groove portion 20, as a result of which the configuration of the surrounding area 32c can be determined according to a depth or an angle of the groove portion 20. For that reason, as compared with the organic electroluminescent display device without the above configuration, a reflected light L from the pixel P is liable to be reflected toward the counter substrate 50 of the surrounding pixels P (P2, P3). For that reason, the higher definition, the higher luminance, and the prevention of color mixture in the organic electroluminescent display device 1 can be realized.

A pixel separation film 14 is formed between the respective adjacent anodes 32, for example, along a boundary B between the respective adjacent pixels P. The pixel separation film 14 has a function of preventing a contact between the respective adjacent anodes 32, and a leakage current between the anode 32 and the cathode 34.

The pixel separation film 14 is formed to cover at least an edge 32d of the anode 32 between the respective pixels P. Also, the pixel separation film 14 is made of an insulating material, and specifically, made of, for example, a photosensitive resin composition.

It is preferable that an upper surface 14a of the pixel separation film 14, which is an interface between the pixel separation film 14 and the organic layer 33, is located closer to the substrate 10 side than the light emitting layer which will be described later. The upper surface 14a of the pixel separation film 14 is located closer to the substrate 10 side than the light emitting layer. As a result, as compared with the organic electroluminescent display device without the above configuration, the reflection of light on the upper surface 14a of the pixel separation film 14, or the upper surface 40a of the sealing film 40 which is the interface between the sealing film 40 and the filler 45 is suppressed. For that reason, even if the distance between the adjacent pixels is shorter, the reflected light is prevented from being emitted from the counter substrates 50 in the pixels P (P2, P3) adjacent to the surrounding. With this configuration, the higher definition, the higher luminance, and the prevention of color mixture in the organic electroluminescent display device 1 can be realized.

Also, the upper surface 14a of the pixel separation film 14 is located closer to the substrate 10 side than the light emitting layer. As a result, a pressure on the filler 45 caused by a swelling toward the substrate 10 side such as steps between the respective areas R, G and B of the color filters in the boundary B of the counter substrate 50 can be absorbed by the upper surface 14a. For that reason, the reliability of the organic electroluminescent display device 1 can be improved.

The organic layer 33 is a layer that has at least the light emitting layer, and is made of an organic material, and formed to cover the plural anodes 33 and the pixel separation film 14. The organic layer 33 may be formed to cover the overall area of the display area D in which the pixel P is arranged. The organic layer 33 has a layer that emits light, and the emitted light may be white or another color.

The organic layer 33 is configured so that, for example, a hole injection layer, a hole transport layer, a light emitting layer, an electron transport layer, and an electron injection layer not shown are laminated in order from the anode 32 side. A laminated structure of the organic layer 33 is not limited to the above case, but the laminated structure is not specified if the organic layer 33 includes at least the light emitting layer.

The light emitting layer is made of an organic electroluminescence material that emits light, for example, by coupling holes with electrons. The organic electroluminescence material of this type to be used may be a material generally used as, for example, an organic light emitting material. It is preferable that the light emitting layer is located closer to the counter substrate 50 side than the upper surface 14a of the pixel separation film 14.

The cathode 34 is formed to cover the organic layer 33. The cathode 34 is not independent from each other for each pixel P, and formed to cover the overall area in which the pixel P is arranged in the display area D. With the provision of the above configuration, the cathode 34 commonly contacts with the respective organic layers 33 of the plural organic electroluminescent light emitting elements 30.

The cathode 34 is made of a material having the translucency and the conductivity. It is specifically preferable that the cathode 34 is made of ITO. Alternatively, the cathode 34 may be made of a conductive metal oxide such as ITO or InZnO mixed with metal such as silver or magnesium, or a laminate of a metal thin film made of silver or magnesium, and the conductive metal oxide.

The upper surface 34a of the cathode 34 above the organic electroluminescent light emitting element 30 is covered with the sealing film 40 over the plural pixels P. The sealing film 40 is a transparent film for preventing oxygen or moisture from penetrating into the respective layers including the organic layer 33.

The upper surface 40a of the sealing film 40 is covered with the counter substrate 50, for example, through the filler 45. The counter substrate 50 is, for example, a substrate having an outer periphery smaller than that of the substrate 10 in a plan view, and arranged to face the substrate 10. Specifically, the counter substrate 50 of this type can be formed of, for example, a color filter substrate, if the light emitting layer of the organic layer 33 emits a white light.

The counter substrate 50 may be partitioned by a black matrix BM formed along the boundary B in correspondence with the respective pixels P. If the counter substrate 50 is a color filter substrate, the counter substrate 50 has, for example, a color filter 48 and a glass substrate 49. The color filter 48 is partitioned into the area R, the area B, and the area G, in correspondence with the respective pixels P (P1, P2, P3) for example, by the black matrix BM, respectively.

The organic electroluminescent display device 1 according to this embodiment has the surrounding area 32c facing the counter substrate 50 of another surrounding pixel P around the contact area 32b of the anode 32. As a result, as illustrated in FIGS. 3 and 4, the light L traveling from the pixel P toward the adjacent pixel P is reflected toward an area corresponding to the original pixel P of the counter substrate 50. Specifically, for example, when the emitted light from the organic layer 33 that comes in contact with the contact area 32b in the pixel P (P1) is reflected from the interfaces of the respective layers such as the upper surface 14a of the pixel separation film 14, or the upper surface 40a of the sealing film 40, the reflected light L travels toward the surrounding area 32c of the surrounding pixels P (P2, P3). Because the surrounding area 32c faces the counter substrate 50 of the pixel P (P1), the reflected light L is reflected toward the area (area R) corresponding to the original pixel P (P1) of the counter substrate 50.

For that reason, even if the distance between the adjacent pixels P is shorter, as compared with the organic electroluminescent display device without the above configuration, the reflected light is prevented from being emitted from the counter substrates 50 in the pixels P (P2, P3) adjacent to the surrounding. With this configuration, the higher definition, the higher luminance, and the prevention of color mixture in the organic electroluminescent display device 1 can be realized.

The embodiments of the invention have been described above, however, the invention is not limited to the above-mentioned embodiments. For example, the configurations of the flattening film. 13 and the pixel separation film. 14 may be different from those illustrated in FIGS. 3 and 4.

For example, in the pixel separation film. 14, a distance from the substrate 10 to the upper surface 14a of the pixel separation film 14 may be substantially equal to a distance from the substrate 10 to the contact area 32b of the anode 32. In the present specification, "substantially equal" includes a range of a manufacturing error.

With the provision of the above configuration, the upper surface 14a of the pixel separation film 14 is a face continuous to the contact area 32b. For that reason, as compared with the organic electroluminescent display device without the above configuration, the upper surface 40a of the sealing film 40 is flat. For that reason, the reflected light from the upper surface 40a of the pixel P (P1) is more surely reflected toward the surrounding areas 32c of the adjacent pixels P (P2, P3). As a result, the higher definition, the higher luminance, and the prevention of color mixture in the organic electroluminescent display device 1 can be realized.

Also, when the upper surface 40a is flattened, the thickness of the filler 45 can be thinned. For that reason, the thinning of the organic electroluminescent display device 1 can be realized.

Also, the upper surface 14a may has a convex shape protruded toward the counter substrate 50 side if the distance from the substrate 10 to the upper surface 14a is shorter than the distance from the substrate 10 to the light emitting layer. FIG. 5 is a schematic cross-sectional view illustrating one modification of the organic electroluminescent display device 1 according to this embodiment, in the same view as that of FIG. 4. With the provision of the above configuration, a pressure on the filler 45 caused by a swelling toward the substrate 10 side such as steps between the respective areas R, G and B of the color filters in the boundary B of the counter substrate 50 can be absorbed by a depression 21 formed by the upper surface 14a and the surrounding area 32c.

Figure 6:
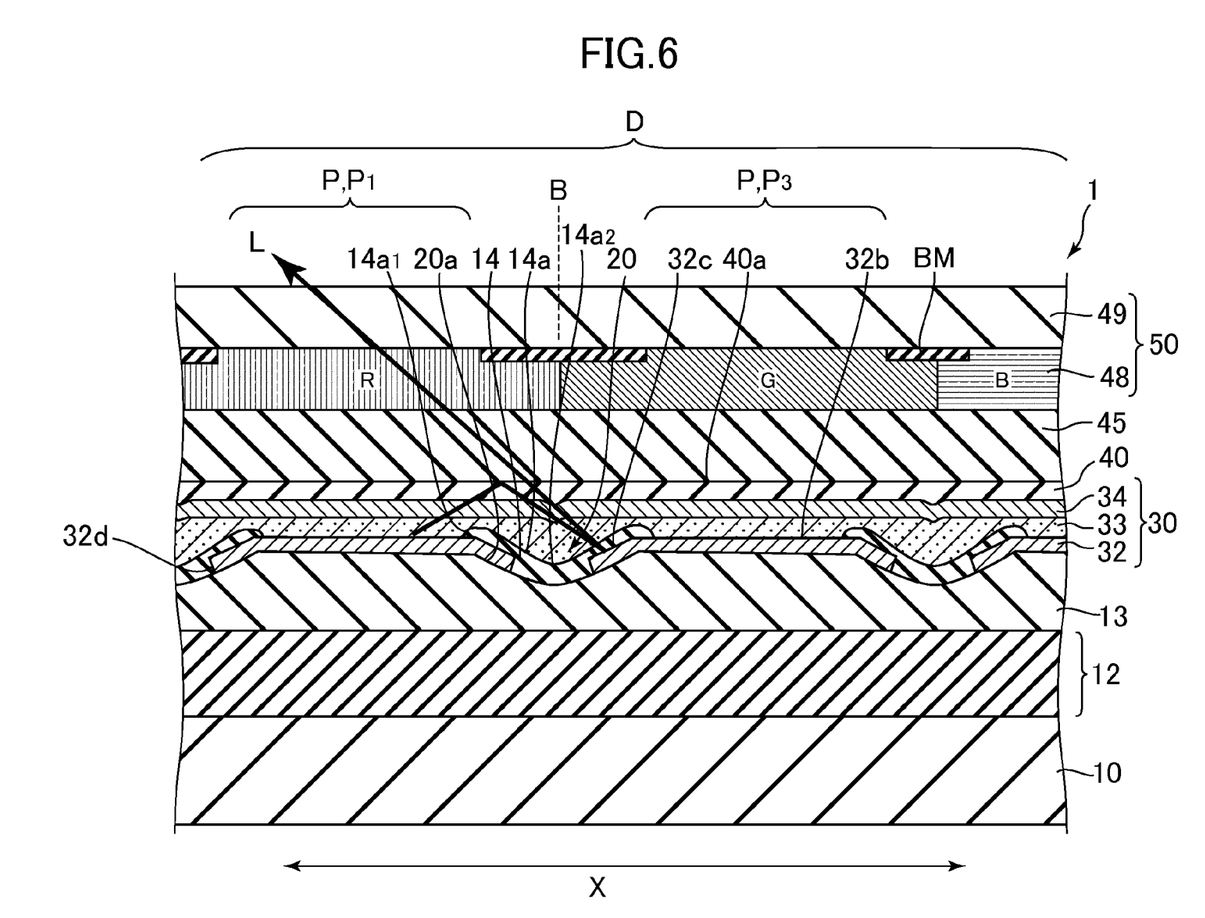
FIG. 6 is a schematic cross-sectional view illustrating another modification of the organic electroluminescent display device according to this embodiment, in the same view as that of FIG. 4.

Also, the upper surface 14a may have a concave shape depressed toward the substrate 10 side. FIG. 6 is a schematic cross-sectional view illustrating another modification of the organic electroluminescent display device according to this embodiment, in the same view as that of FIG. 4. Specifically, a center portion 14a2 which is a portion corresponding to the boundary B of the upper surface 14a may be located closer to the substrate 10 side than an end 14a1 of the upper surface 14a on the pixel P side.

With the provision of the above configuration, as compared with the organic electroluminescent display device without the above configuration, the organic layer 33 on the groove portion 20 is thickened. For that reason, a distance until the emitted light from the organic layer 33 that comes in contact with the contact area 32b in the pixel P (P1) is reflected from the upper surface 40a of the sealing film 40, and arrives at the pixel separation film 14 of the surrounding pixel P (P3) becomes longer. As a result, as compared with the organic electroluminescent display device without the above configuration, the reflection on the upper surface 14a of the pixel separation film 14 is suppressed, and the prevention of the color mixture in the organic electroluminescent display device 1 can be realized.

Figure 7:
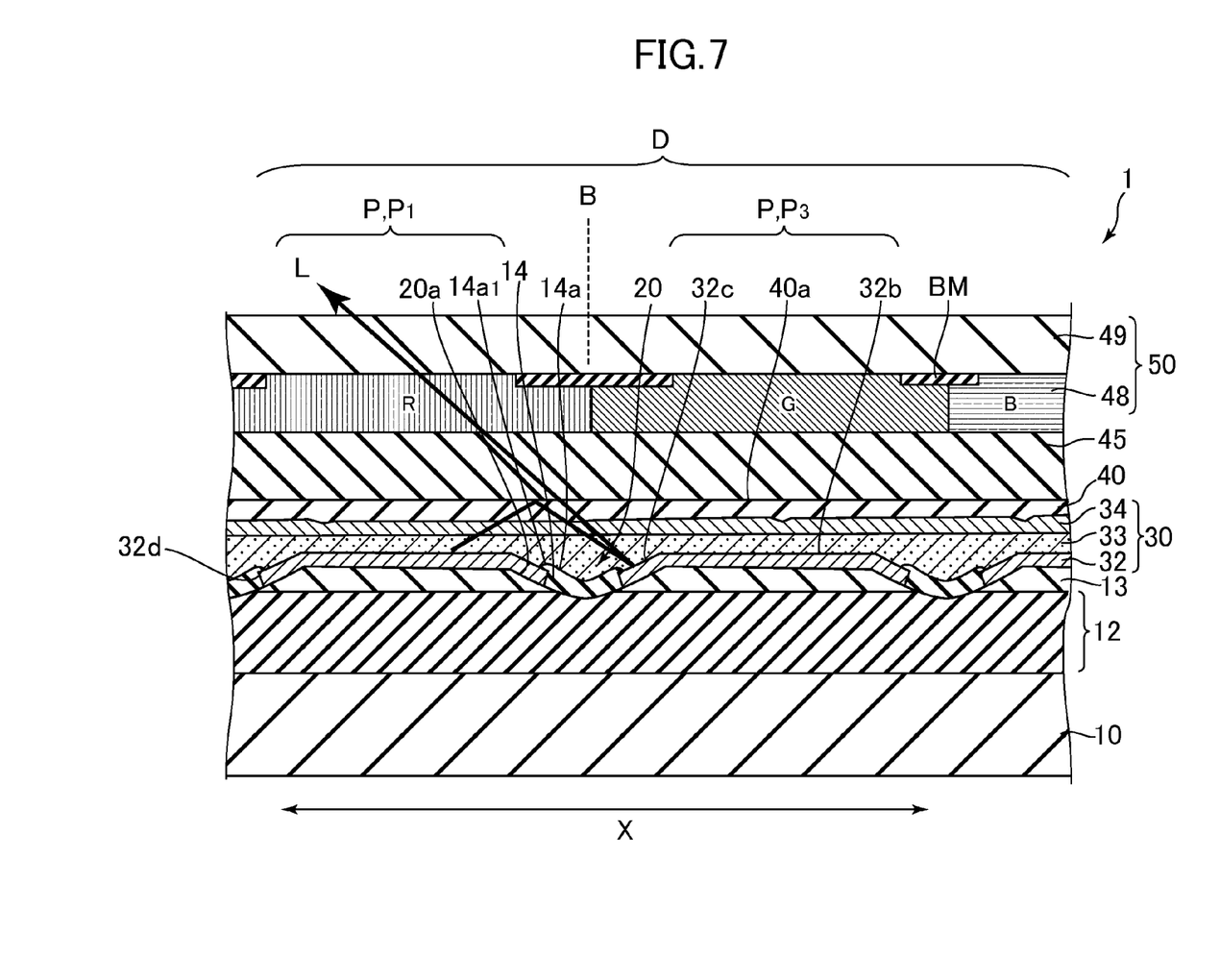
FIG. 7 is a schematic cross-sectional view illustrating still another modification of the organic electroluminescent display device according to this embodiment, in the same view as that of FIG. 4.

Also, the pixel separation film 14 may cover at least a part of the groove portion 20. FIG. 7 is a schematic cross-sectional view illustrating still another modification of the organic electroluminescent display device according to this embodiment, in the same view as that of FIG. 4. It is preferable that an area in which the groove portion 20 is covered with the pixel separation film 14 is smaller, and as illustrated in FIG. 7, an end 14a1 of the pixel separation film 14 has only to cover an edge 32d of the anode 32.

With the provision of the above configuration, as compared with the organic electroluminescent display device without the above configuration, the light emitting area of the organic layer 33 becomes larger in the organic electroluminescent display device 1. For that reason, the luminance is improved, and a current density is lowered with the result that the durability of the organic electroluminescent display device 1 can be improved. Also, as compared with the organic electroluminescent display device without the above configuration, because the size of an area of the surrounding area 32c which is covered with the pixel separation film 14 is reduced, the reflection efficiency in the surrounding area 32c can be improved. For that reason, the prevention of color mixture and an improvement in the luminance can be realized.

Also, as illustrated in FIG. 7, the flattening film 13 may be separated from each other for the respective pixels P. Specifically, for example, the groove portion 20 penetrates the flattening film 13 with the result that the flattening film 13 formed on the pixel P(P1) is separated from the flattening film 13 formed on the pixel P(P3) adjacent to the pixel P(P1) in the X-direction.

With the provision of the above configuration, the organic electroluminescent display device 1 according to this embodiment can adjust a depth of the groove portion 20 according to the thickness of the flattening film 13. With this configuration, the thickness of the flattening film 13 can be thinned, thereby being capable of realizing thinning of the organic electroluminescent display device 1

Figure 8:
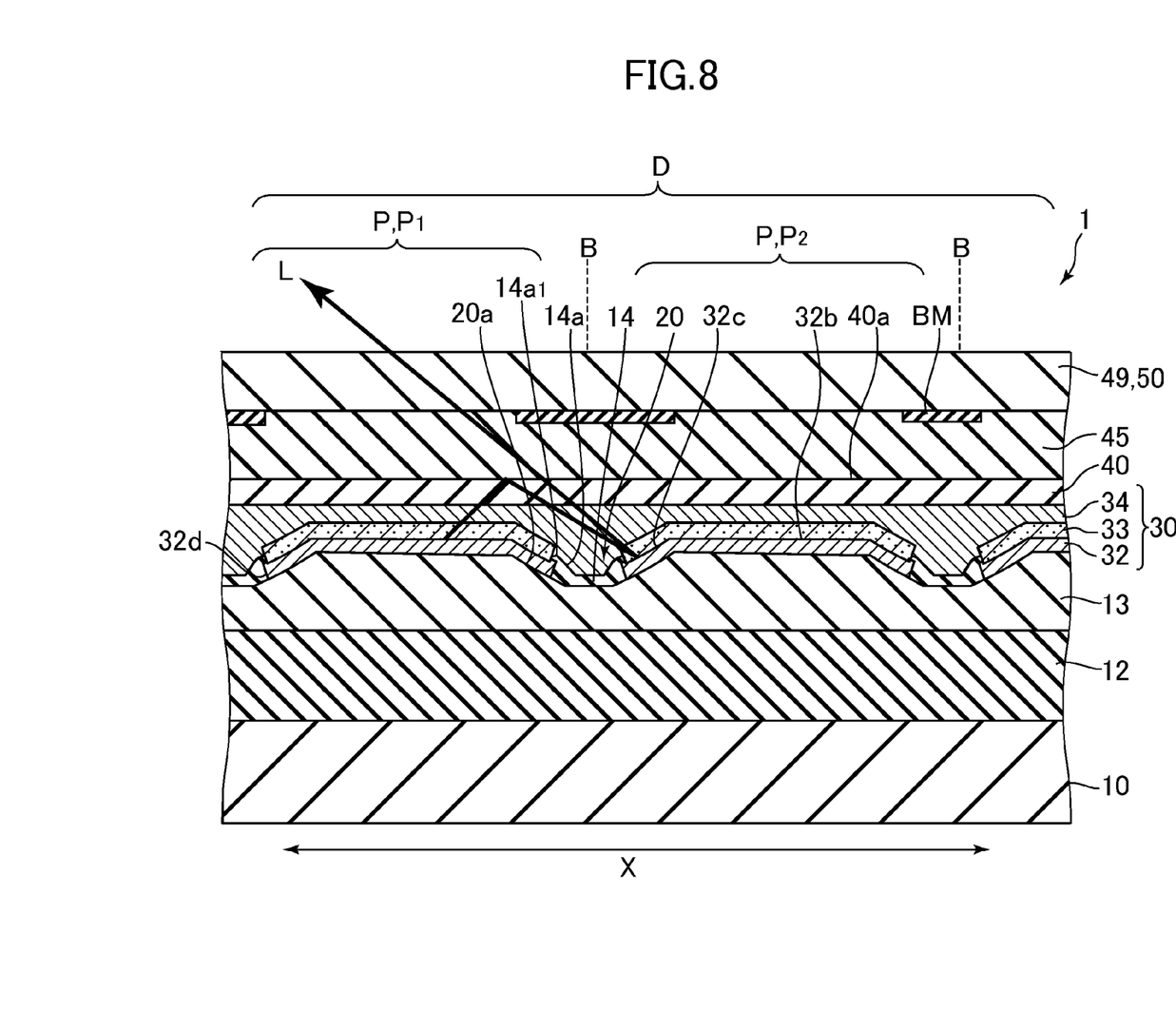
FIG. 8 is a schematic cross-sectional view illustrating yet another modification of the organic electroluminescent display device according to this embodiment, in the same view as that of FIG. 4.

Also, in the organic electroluminescent display device 1 according to this embodiment, two or more light emitting layers that emit light having a different wavelength range different from each other may be formed for each of the pixels P. FIG. 8 is a schematic cross-sectional view illustrating yet another modification of the organic electroluminescent display device 1 according to this embodiment, in the same view as that of FIG. 4.

With the provision of the above configuration, the organic electroluminescent display device 1 according to this embodiment is applied to the organic electroluminescent display device having no color filter substrate, thereby being capable of realizing more thinning, and preventing color mixture.

The embodiments of the invention have been described above, but the invention is not limited to the above-mentioned embodiments. For example, the configurations described in the above embodiments can be replaced with the substantially same configurations, configurations having the identical function effects, or configurations that can achieve the same purpose.

What is claimed is:

1. An organic electroluminescent display device, comprising:
    a substrate;
    a plurality of anodes that are formed in respective pixels arranged in a display area of the substrate in a matrix;
    pixel separation films that are made of an insulating material, and cover at least an edge of the respective anodes between the respective pixels;
    an organic layer that is made of an organic material, covers the display area over the plurality of anodes, and the pixel separation films, and includes at least a light emitting layer;
    a cathode that is formed on the organic layer;
    a counter substrate that is arranged on the cathode so as to face the substrate;
    a plurality of thin film transistors each electrically connected with each of the anodes; and
    an insulating film that is arranged between the substrate and the anodes, and has a groove portion between the respective pixels, the groove portion being recessed toward the substrate,
    wherein the anodes each include:
    a contact area that comes in contact with the organic layer, and faces a corresponding pixel of the counter substrate, and
    a peripheral area that is formed around the contact area, and faces pixels around the corresponding pixels of the counter substrate, and
    wherein the peripheral area extends along the groove portion and is not in contact with an electrode of one of the thin film transistors.

2. The organic electroluminescent display device according to claim 1, wherein the peripheral area faces the pixel adjacent to the corresponding pixel of the counter substrate.

3. The organic electroluminescent display device according to claim 1,
wherein the insulating film is separated for each of the pixels.

4. The organic electroluminescent display device according to claim 1,
wherein the pixel separation films each cover at least a part of the groove portion.

5. The organic electroluminescent display device according to claim 1,
wherein the counter substrate is a color filter substrate.

6. The organic electroluminescent display device according to claim 1,
wherein the anodes includes a first anode and a second anode that is adjacent to the first anode,
both the peripheral area of the first anode and the peripheral area of the second anode are located on the groove portion together.

* * * * *